United States Patent
Goodlin et al.

(10) Patent No.: US 7,018,888 B2
(45) Date of Patent: Mar. 28, 2006

(54) METHOD FOR MANUFACTURING IMPROVED SIDEWALL STRUCTURES FOR USE IN SEMICONDUCTOR DEVICES

(75) Inventors: Brian E. Goodlin, Dallas, TX (US); Amitava Chatterjee, Plano, TX (US); Shirin Siddiqui, Plano, TX (US); Jong S. Yoon, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/902,902

(22) Filed: Jul. 30, 2004

(65) Prior Publication Data

US 2006/0024872 A1    Feb. 2, 2006

(51) Int. Cl.
*H01L 21/8238* (2006.01)

(52) U.S. Cl. .................................... 438/230
(58) Field of Classification Search ............... 438/197, 438/199, 231, 241, 297, 299, 305, 302, 307, 438/535, 775, 725
See application file for complete search history.

(56) References Cited

U.S. PATENT DOCUMENTS

| | | | | |
|---|---|---|---|---|
| 5,498,555 A | * | 3/1996 | Lin | 438/302 |
| 5,607,884 A | * | 3/1997 | Byun | 438/297 |
| 5,920,774 A | * | 7/1999 | Wu | 438/224 |
| 6,187,620 B1 | * | 2/2001 | Fulford et al. | 438/230 |
| 6,337,240 B1 | * | 1/2002 | Chu | 438/241 |
| 6,660,605 B1 | * | 12/2003 | Liu | 438/307 |
| 6,797,576 B1 | * | 9/2004 | Teng et al. | 438/305 |
| 6,806,149 B1 | * | 10/2004 | Bu et al. | 438/299 |
| 6,902,966 B1 | * | 6/2005 | Yu et al. | 438/197 |
| 2003/0082880 A1 | * | 5/2003 | Yu et al. | 438/299 |
| 2004/0126976 A1 | * | 7/2004 | Cho | 438/299 |
| 2005/0059260 A1 | * | 3/2005 | Bu et al. | 438/775 |

* cited by examiner

*Primary Examiner*—Michael Lebentritt
*Assistant Examiner*—André C. Stevenson
(74) *Attorney, Agent, or Firm*—Peter K. McLarty; W. James Brady, III; Frederick J. Telecky, Jr.

(57) ABSTRACT

The present invention provides a method for manufacturing a semiconductor device and method for manufacturing an integrated circuit including the semiconductor device. The method for manufacturing a semiconductor device (100), among other steps, includes forming a gate structure (130) over a substrate (110), the gate structure (130) having sidewall spacers (210 or 410) on opposing sidewalls thereof and placing source/drain implants (310, 510) into the substrate (110) proximate the gate structure (130). The method further includes removing at least a portion of the sidewall spacers (210 or 410) and annealing the source/drain implants (310, 510) to form source/drain regions (710) after removing the at least a portion of the sidewall spacers (210 or 410).

18 Claims, 9 Drawing Sheets

METHOD FOR MANUFACTURING IMPROVED SIDEWALL STRUCTURES FOR USE IN SEMICONDUCTOR DEVICES

TECHNICAL FIELD OF THE INVENTION

The present invention is directed, in general, to a method for manufacturing a semiconductor device and, more specifically, to a method for manufacturing improved sidewall structures for use in semiconductor devices and a method for manufacturing a integrated circuit using the improved sidewall structures.

BACKGROUND OF THE INVENTION

As CMOS technology continues to scale further into the sub-micron region, the width of the gate structure on metal oxide semiconductor (MOS) transistors is constantly being reduced. MOS transistor gate structures are formed using conductive materials such as metals, silicides, and doped polycrystalline silicon (polysilicon). For MOS transistor gate structures formed using doped polysilicon, metal silicides are often formed on the gate structure to reduce the sheet resistance of the gate structure and to ensure proper electrical contact. The sheet resistance of the gate structure should be as low as possible for proper MOS transistor operation. As the width of the polysilicon gate structure is reduced the sheet resistance of the gate structure rises due in part to the thinner metal silicide regions that are formed on the polysilicon gate structures using existing fabrication methods. The increased sheet resistance is becoming a major limitation of the MOS transistor performance.

The self-aligned process used to fabricate MOS transistors requires the formation of a sidewall structure prior to the formation of the transistor source/drain regions. Along with the reduction in MOS transistor gate structure width, the scaling of CMOS technology also requires that the width of the sidewall structures be reduced. The width of the sidewall structures determine how far from the edge of the gate structure the source/drain regions are located. A thermal annealing process designed to activate the source/drain regions unfortunately typically pushes the edge of the source/drain regions towards the edge of the transistor gate structure. Reducing the width of the sidewall structures is therefore limited by the thermal diffusion process that takes place during the source/drain region annealing.

As CMOS technology continues to scale there is therefore an increasing need for a method to scale the width of the sidewall spacers without causing the source/drain regions to be positioned in such a region as to negatively affect the MOS transistor.

SUMMARY OF THE INVENTION

To address the above-discussed deficiencies of the prior art, the present invention provides a method for manufacturing a semiconductor device and method for manufacturing an integrated circuit including the semiconductor device. The method for manufacturing a semiconductor device, among other steps, includes forming a gate structure over a substrate, the gate structure having sidewall spacers on opposing sidewalls thereof and placing source/drain implants into the substrate proximate the gate structure. The method further includes removing at least a portion of the sidewall spacers and annealing the source/drain implants to form source/drain regions after removing the at least a portion of the sidewall spacers.

As previously mentioned the present invention further includes a method for manufacturing an integrated circuit. The method for manufacturing the integrated circuit, in addition to that set forth in the paragraph above, includes forming dielectric layers over the semiconductor devices, the dielectric layers having interconnects therein for contacting the semiconductor devices and thereby forming an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
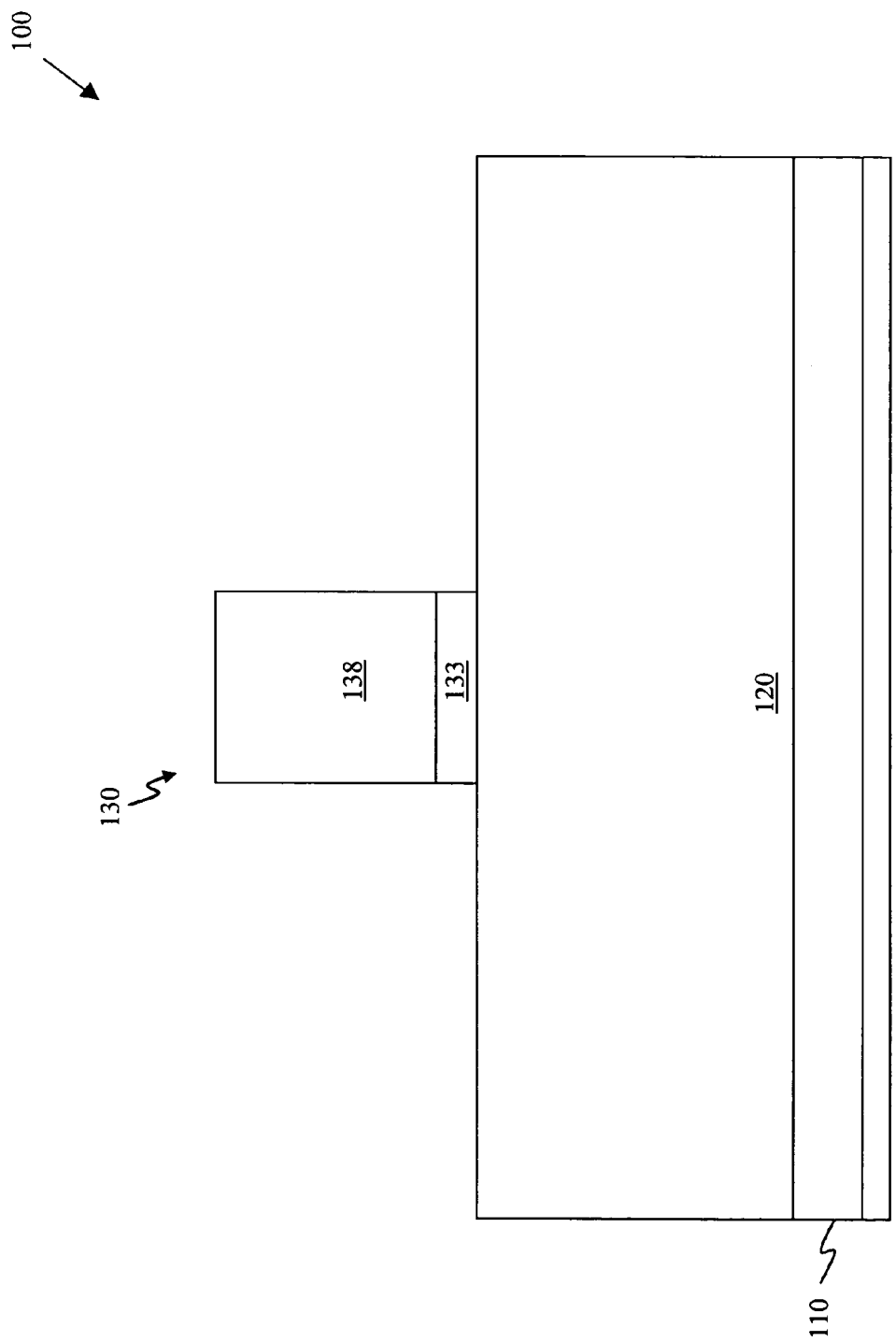
FIG. 1 illustrates a cross-sectional view of a partially completed semiconductor device manufactured in accordance with the principles of the present invention.

The present invention is based in part on a collection of individual ideas that were never really appreciated for what they added, and therefore were never brought together prior to the identification of the present invention. One idea is based upon the recognition that hydrogen outdiffusion of the source/drain regions, especially in the case of p-channel metal oxide semiconductor (PMOS) devices, increases the device performance thereof.

The second idea is based upon the recognition that semiconductor device performance may also be increased by reducing the sidewall spacer thickness of the semiconductor device. In one scenario, which is covered by the application upon which this application obtains its priority date, the sidewall spacer thickness of the semiconductor device is reduced after implanting and thermally annealing the source/drain regions in the substrate. It has been observed that such a process substantially reduces the resistance that occurs between the poly lines, substantially reduces "wormhole defects" caused by oxide recesses formed in the substrate between the sidewall spacers of adjacent semiconductor devices, and allows a thicker PMD liner to be formed over and between adjacent semiconductor devices, and therefore, more tensile stress may advantageously be incorporated in the channel region of the semiconductor devices.

The present invention, in contrast to the prior art, made the recognition that these two significant ideas could be used together to manufacture exemplary semiconductor devices. Specifically, the present invention recognized that increased semiconductor device performance, even above the performance obtainable using the two ideas mentioned above, may be attained by forming the source/drain implants in the substrate, then reducing the sidewall thickness of the sidewall spacers, and then annealing the source/drain implants to form source/drain regions. As the source/drain implants are annealed after the reduction in width of the sidewall spacers, an increased amount of hydrogen is allowed to outgass from the substrate. As an increased amount of hydrogen outdiffusion occurs, the semiconductor device performance also increases.

Accordingly, semiconductor devices manufactured using the methodology of the present invention take advantage of the sidewall spacer etchback, as well as the increased hydrogen outdifussion caused by the annealing of the source/drain implants after the sidewall spacer etchback. Therefore, the present invention provides a method to etchback the spacer to reduce resistance problems, "wormhole defect" problems, and PMD liner problems. Additionally, the method allows for good control of the sidewall spacer critical dimension (CD) during source/drain implant and after sidewall spacer etchback. Likewise, it allows for hydrogen diffusion from the source/drain implant regions during anneal. Also, a fact that will be discussed further below, it allows for the elimination of L-shaped spacers which often introduce potential controllability issues.

Turning now to FIGS. 1–8 illustrated are cross-sectional views of detailed manufacturing steps illustrating how one might manufacture a semiconductor device in accordance with the principles of the present invention. FIG. 1 illustrates a cross-sectional view of a partially completed semiconductor device 100 manufactured in accordance with the principles of the present invention. From the outset, it should be noted that the embodiments of FIGS. 1–8 will be discussed as a p-channel metal oxide semiconductor (PMOS) device. In an alternative embodiment, all the dopant types, except for possibly the substrate dopant, could be reversed, resulting in an n-channel metal oxide semiconductor (NMOS) device. However, at least with regard to FIGS. 1–8, no further reference to this opposite scheme will be discussed.

In the advantageous embodiment shown, the partially completed semiconductor device 100 of FIG. 1 includes a substrate 110. The substrate 110 may, in an exemplary embodiment, be any layer located in the partially completed semiconductor device 100, including a wafer itself or a layer located above the wafer (e.g., epitaxial layer). In the embodiment illustrated in FIG. 1, the substrate 110 is a P-type substrate; however, one skilled in the art understands that the substrate 110 might be an N-type substrate without departing from the scope of the present invention.

Located within the substrate 110 in the embodiment shown in FIG. 1 is a well region 120. The well region 120 in the embodiment illustrated in FIG. 1 contains an N-type dopant. For example, the well region 120 would likely be doped with an N-type dopant dose ranging from about 1E13 atoms/cm$^2$ to about 1E14 atoms/cm$^2$ and at an energy ranging from about 100 keV to about 500 keV. This results in the well region 120 having a peak dopant concentration ranging from about 5E17 atoms/cm$^3$ to about 1E19 atoms/cm$^3$.

Located over the substrate 110 in the embodiment of FIG. 1 is a gate structure 130. The gate structure 130 includes a gate dielectric layer 133 and a polysilicon gate electrode layer 138. The gate dielectric layer 133 may comprise a number of different materials and stay within the scope of the present invention. For example, the gate dielectric layer 133 may comprise silicon dioxide, or in an alternative embodiment comprise a high dielectric constant (K) material. In the illustrative embodiment of FIG. 1, however, the gate dielectric layer 133 is a silicon dioxide layer having a thickness ranging from about 0.5 nm to about 5 nm.

Any one of a plurality of manufacturing techniques could be used to form the gate dielectric layer 133. For example, the gate dielectric layer 133 may be either grown or deposited. Additionally, the growth or deposition steps may require a significant number of different temperatures, pressures, gasses, flow rates, etc.

While the advantageous embodiment of FIG. 1 discloses that the polysilicon gate electrode layer 138 comprises standard polysilicon, other embodiments exist where the polysilicon gate electrode layer 138, or at least a portion thereof, comprises amorphous polysilicon. The amorphous polysilicon embodiment may be particularly useful when a substantially planar upper surface of the polysilicon gate electrode layer 138 is desired.

The deposition conditions for the polysilicon gate electrode layer 138 may vary, however, if the polysilicon gate electrode layer 138 were to comprise standard polysilicon, such as the instance in FIG. 1, the polysilicon gate electrode layer 138 could be deposited using a pressure ranging from about 100 torr to about 300 torr, a temperature ranging from about 620° C. to about 700° C., and a $SiH_4$ or $Si_2H_6$ gas flow ranging from about 50 sccm to about 150 sccm. If, however, amorphous polysilicon were desired, the amorphous polysilicon gate electrode could be deposited using a pressure ranging from about 100 torr to about 300 torr, a temperature ranging from about 450° C. to about 550° C., and a $SiH_4$ or $Si_2H_6$ gas flow ranging from about 100 sccm to about 300 sccm. In any instance, the polysilicon gate electrode layer 138 desirably has a thickness ranging from about 50 nm to about 150 nm.

Figure 2:
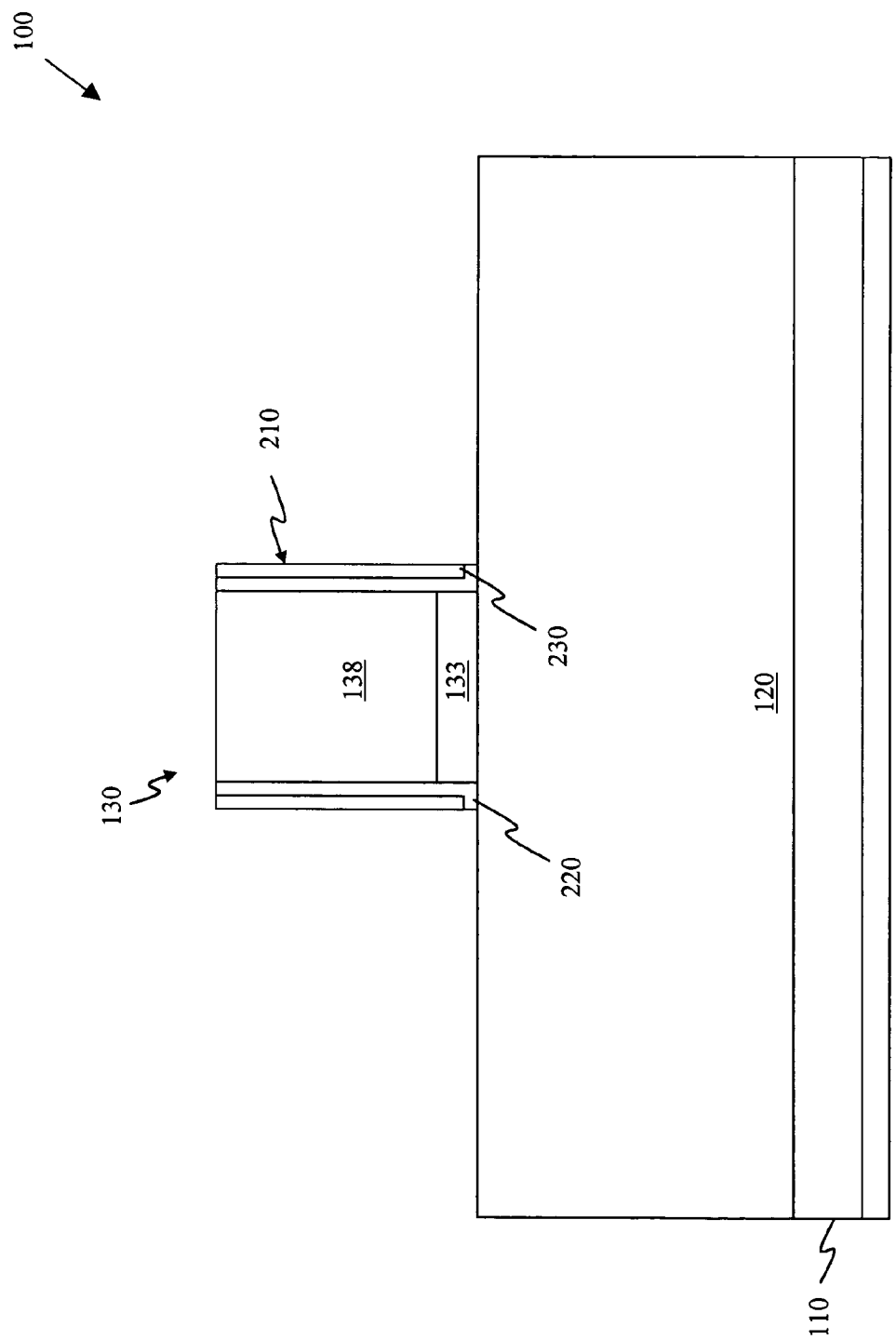
FIG. 2 illustrates a cross-sectional view of the partially completed semiconductor device illustrated in FIG. 1 after formation of source/drain extension offset spacers.

Turning briefly to FIG. 2, illustrated is a cross-sectional view of the partially completed semiconductor device 100 illustrated in FIG. 1 after formation of source/drain extension offset spacers 210. The source/drain extension offset spacers 210 shown in FIG. 2 include a conventional oxide layer 220 and an offset nitride spacer 230. In an exemplary process the oxide layer 220 is initially formed using a first deposition process, and then finished using a second oxidation process. The first deposition process allows the oxide layer 220 to form on non silicon regions of the gate structure 130, when required. In an alternative embodiment, however, the entire oxide layer 220 is either grown or deposited.

The offset nitride spacer 230 may comprise a standard silicon nitride spacer or a silicon nitride layer having carbon therein. If the offset nitride spacer 230 were to contain the carbon, the carbon might form from about 5% to about 10% of the layer. While the oxide layer 220 and the offset nitride spacer 230 are shown located only along the sides of the gate structure 130, those skilled in the art are aware that the layers were previously blanket formed and subsequently anisotropically etched to form the oxide layer 220 and the offset nitride spacer 230. It should be noted that certain embodiments may exist where the blanket oxide layer 220 and blanket nitride layer 230 would remain at this point and not be anisotropically etched as shown in FIG. 2.

Figure 3:
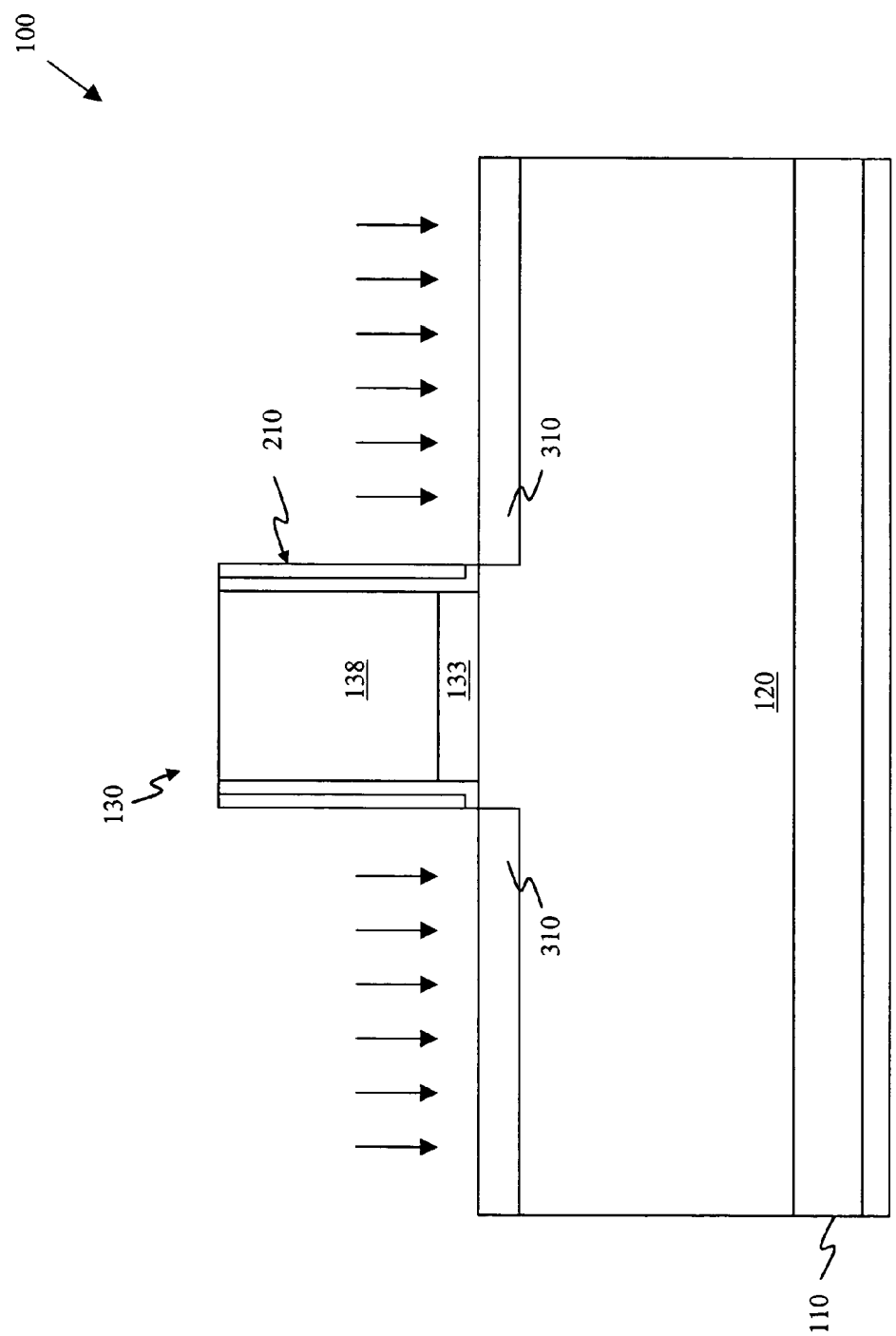
FIG. 3 illustrates a cross-sectional view of the partially completed semiconductor device illustrated in FIG. 2 after formation of lightly doped source/drain extension implants within the substrate.

Turning now to FIG. 3, illustrated is a cross-sectional view of the partially completed semiconductor device 100 illustrated in FIG. 2 after formation of lightly doped source/drain extension implants 310 within the substrate 110. The lightly doped source/drain extension implants 310 are conventionally formed and generally have a peak dopant concentration ranging from about 1E19 atoms/cm$^3$ to about 2E20 atoms/cm$^3$. As is standard in the industry, the lightly doped source/drain extension implants 310 have a dopant type opposite to that of the well region 120 they are located within. Accordingly, the lightly doped source/drain extension implants 310 are doped with a P-type dopant in the illustrative embodiment shown in FIG. 3.

Figure 4A:
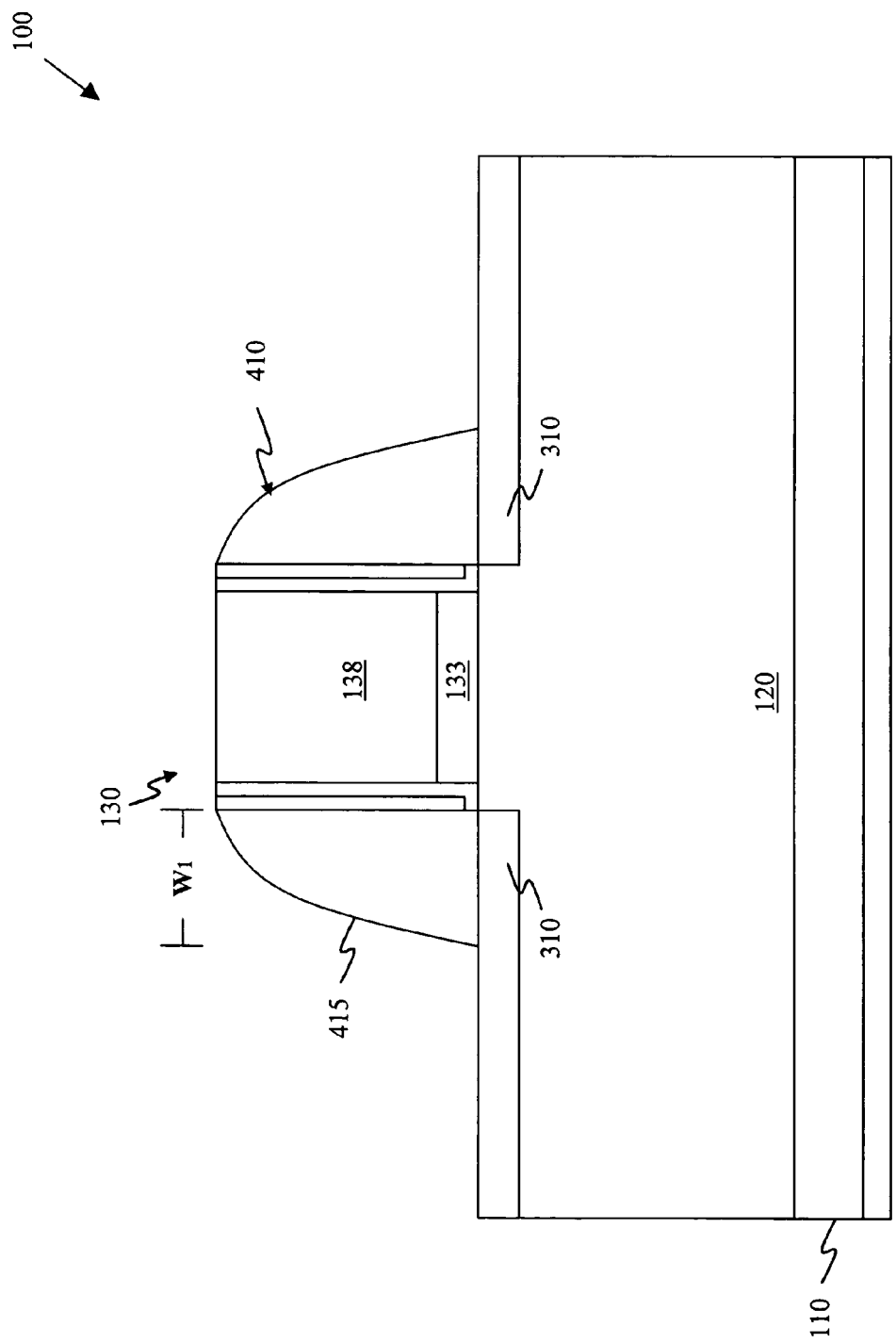
FIG. 4A illustrates a cross-sectional view of the partially completed semiconductor device illustrated in FIG. 3 after forming source/drain sidewall spacers.

Turning now to FIG. 4A, illustrated is a cross-sectional view of the partially completed semiconductor device 100 illustrated in FIG. 3 after forming source/drain sidewall spacers 410. The source/drain sidewall spacers 410 illustrated in FIG. 4A consists of forming traditional sidewall spacers 415 along the sidewalls of the gate structure 130. The desired traditional sidewall spacers 415 advantageously comprise sidewall spacers similar to those used in many previous generation devices, for example, single layer sidewall spacers. In the embodiment shown in FIG. 4A, the traditional sidewall spacers 415 are all nitride source/drain implant sidewall spacers. While the traditional sidewall spacers 415 illustrated in FIG. 4A comprise nitride spacers, those skilled in the art understand that other materials, including oxides, could be used.

The traditional sidewall spacers 415 illustrated in FIG. 4a may be conventionally manufactured. For example, in one embodiment a blanket layer of nitride material is deposited over the gate structure 130 and substrate 110 and thereafter subjected to a typical anisotropic etch. The resulting structures, in such an embodiment, would approximate the traditional sidewall spacers 415 illustrated in FIG. 4a. While the traditional sidewall spacers 415 may have a range of widths ($W_1$), one embodiment has the traditional sidewall spacers 415 having widths ($W_1$) ranging from about 35 nm to about 100 nm. As the process for forming the traditional sidewall spacers 415 has been used for many years, no further detail is required.

Figure 4B:
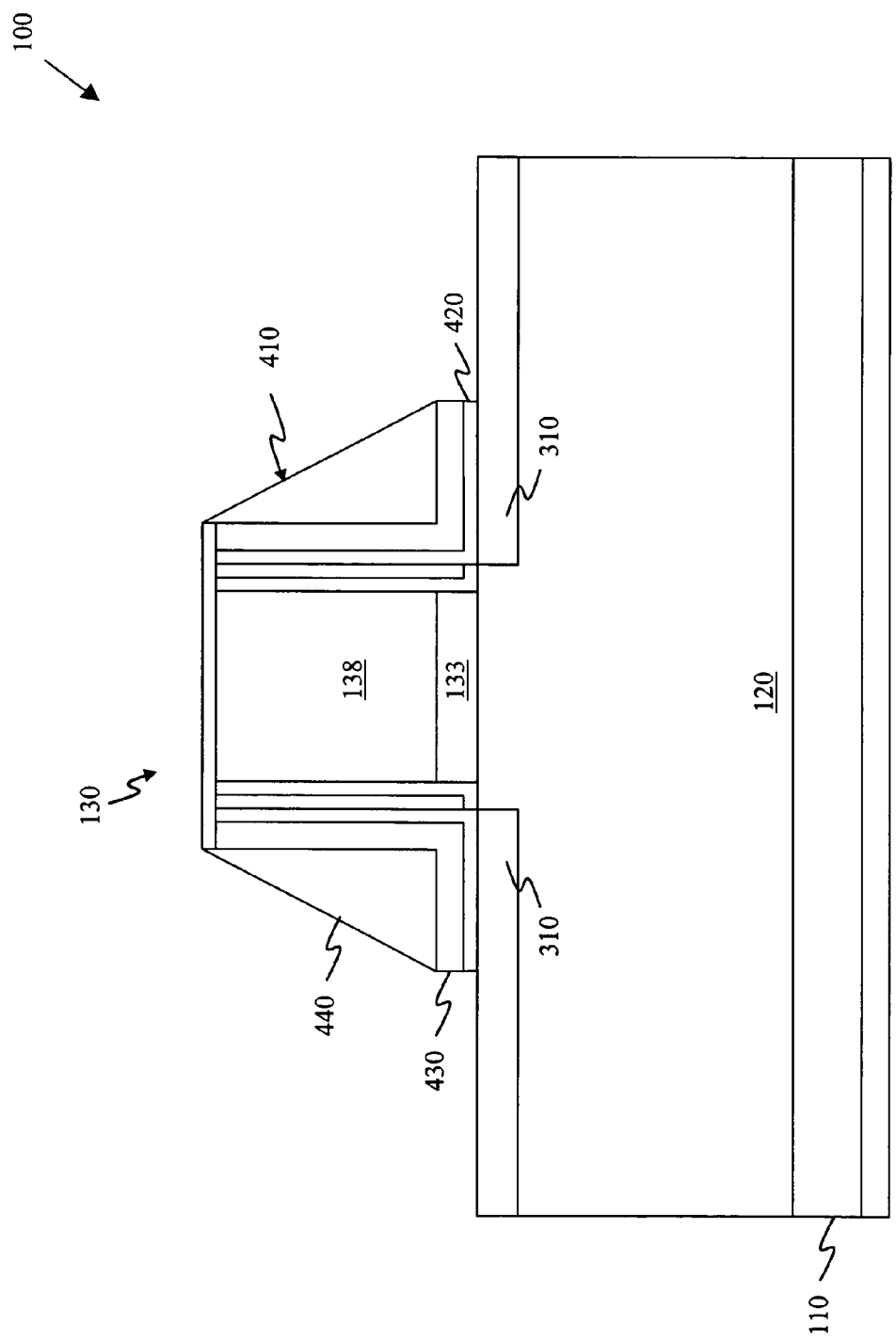
FIG. 4B illustrates a cross-sectional view of an alternative embodiment of the partially completed semiconductor device illustrated in FIG. 4A.

Turning briefly to FIG. 4B, illustrated is a cross-sectional view of an alternative embodiment of the partially completed semiconductor device 100 illustrated in FIG. 4A. The partially completed semiconductor device 100 illustrated in FIG. 4B includes a different type of source/drain sidewall spacer 410 than that illustrated in FIG. 4A. Where the embodiment of FIGURE 4A used the traditional sidewall spacers 415, the embodiment of FIG. 4B uses L-shaped sidewall spacers.

For example, the source/drain sidewall spacers 410 illustrated in FIG. 4B comprise, as compared to those of FIG. 4A, a cap oxide 420, L-shaped nitride spacers 430 and sidewall oxides 440. The cap oxide 420, among other purposes, has the job of preventing the L-shaped nitride spacers 430 from directly contacting the substrate 110. Most likely, the cap oxide 420 will be deposited over the partially completed semiconductor device 100 using a process similar to that used to form the oxide layer 220.

The L-shaped nitride spacers 430 may comprise any type of nitride, however, in an exemplary embodiment the L-shaped nitride spacers 430 comprise a nitride material that includes carbon. The carbon content, which may range from about 5% to about 10% of the L-shaped nitride spacers 430, is included within the L-shaped nitride spacers 430 to change the rate at which they etch. In the embodiment where the L-shaped nitride spacers 430 include carbon, the L-shaped nitride spacers 430 may be deposited using bis t-butylaminosilane (BTBAS) and ammonia ($NH_3$) precursors in a CVD reactor. Advantageously, the carbon causes the L-shaped nitride spacers 430 to etch at a slower rate than a traditional nitride layer. In an exemplary situation, after having been annealed using a temperature ranging from about 1000° C. to about 1100° C., the carbon causes the L-shaped nitride spacers 430 to have an etch selectivity of about 50:1 when compared to the traditional nitride layer.

The sidewall oxides 440 that are located over the L-shaped nitride spacers 430 are conventional. In the given embodiment of FIG. 4B, the sidewall oxides 440 were blanket deposited and then subjected to an anisotropic etch. The resulting sidewall oxides 440 complete the source/drain sidewall spacers 410 illustrated in the embodiment of FIG. 4B.

Figure 5:
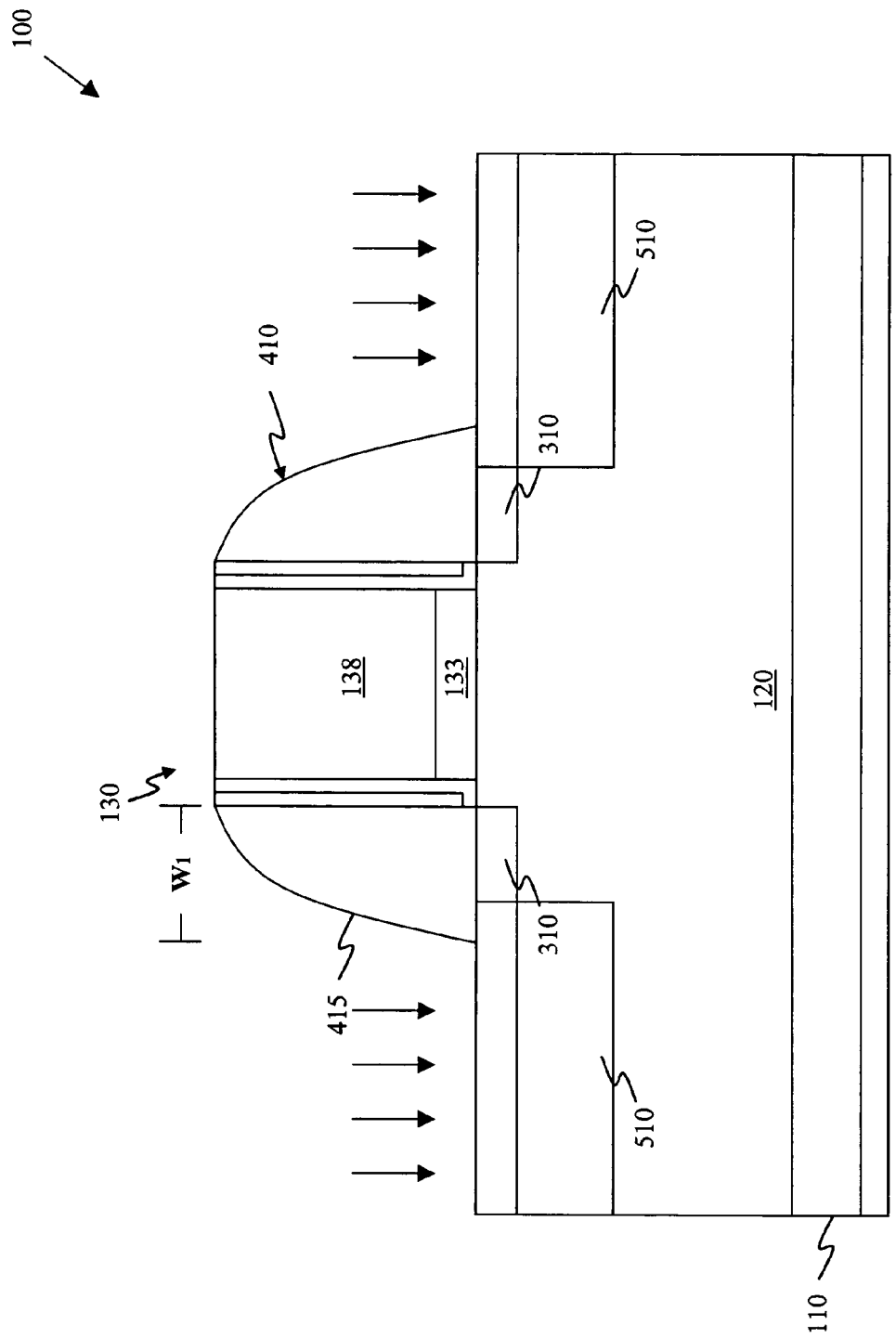
FIG. 5 illustrates a cross-sectional view of the partially completed semiconductor device illustrated in FIG. 4A after the formation of highly doped source/drain implants within the substrate.

While the embodiment of FIG. 4B is illustrated, an exemplary embodiment of the present invention would use the embodiment of FIG. 4A. Specifically, it is believed that the source/drain sidewall spacers 410 of FIG. 4B were originally designed to allow an increased amount of hydrogen to outdiffuse from the substrate 110 during the annealing of the source/drain implants (FIG. 5). As the hydrogen outdiffusion is now increased by etching back the source/drain sidewall spacers 410 prior to the anneal of the source/drain implants (FIG. 5), the increased difficulty in manufacturing the source/drain sidewall spacers 410 of FIG. 4B are not warrented in most embodiments. Certain embodiment would exist, however, where the source/drain sidewall spacers 410 of FIG. 4B would be used.

Turning now to FIG. 5, illustrated is a cross-sectional view of the partially completed semiconductor device 100 illustrated in FIG. 4A after the formation of highly doped source/drain implants 510 within the substrate 110. Those skilled in the art understand the conventional processes that could be used to form the highly doped source/drain implants 510. Generally the highly doped source/drain implants 510 have a peak dopant concentration ranging from about 1E18 atoms/cm$^3$ to about 1E21 atoms/cm$^3$. Also, the highly doped source/drain implants 510 should typically have a dopant type opposite to that of the well region 120 they are located within. Accordingly, in the illustrative embodiment shown in FIG. 5, the highly doped source/drain implants 510 are doped with a P-type dopant.

Figure 6:
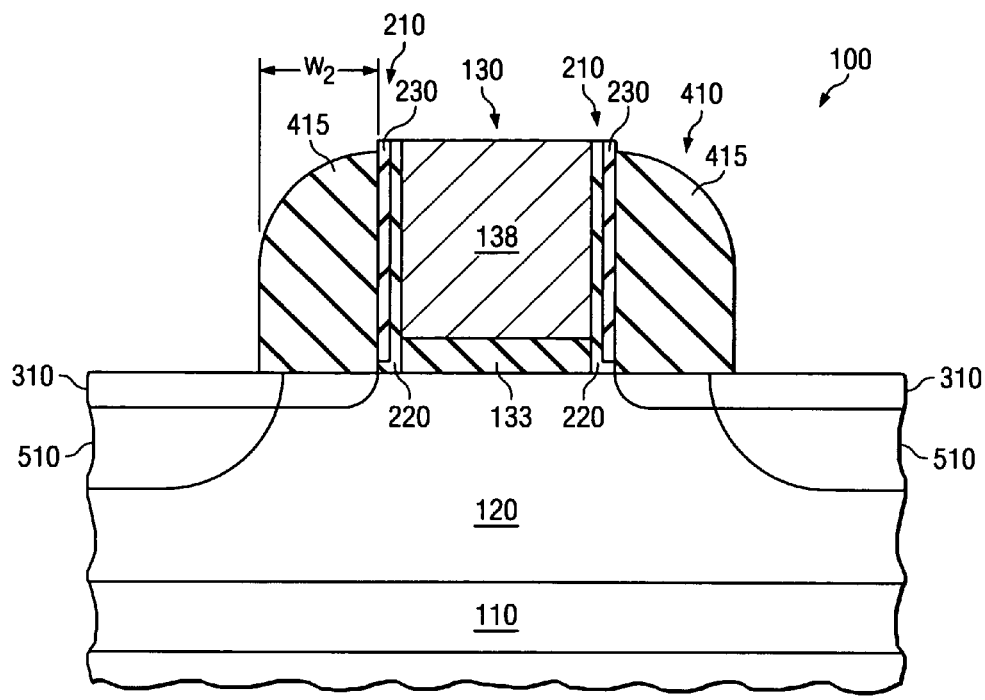
FIG. 6 illustrates a cross-sectional view of the partially completed semiconductor device illustrated in FIG. 5 after removing at least a portion of the source/drain sidewall spacers or source/drain extension offset spacers.

Turning now to FIG. 6, illustrated is a cross-sectional view of the partially completed semiconductor device 100 illustrated in FIG. 5 after removing at least a portion of the source/drain sidewall spacers 410 or source/drain extension offset spacers 210. In an advantageous embodiment, up to about 30 nm of width is removed from each of the source/drain sidewall spacers 410. In an even more advantageous embodiment, from about 10 nm of width to about 20 nm of width is removed from each of the source/drain sidewall spacers 410. A resulting width ($W_2$) of the traditional sidewall spacers 415 should, in the embodiment shown, range from about 20 nm to about 80 nm.

In the illustrative embodiment shown in FIG. 6, portions of the traditional sidewall spacer 415 are removed. While not shown, certain embodiments exist where other portions of the source/drain extension offset spacers 210, including but not limited to the oxide layer 220 and the offset nitride spacer 230, are removed. For example, the tops of the traditional sidewall spacers 415, oxide layers 220 and offset nitride spacers 230 could be removed using the aforementioned removal process.

Those skilled in the art understand the processes that could be used to remove at least a portion of the source/drain sidewall spacers 410. In an exemplary embodiment, a dry etch process, such as a dry plasma etch process, is used to remove at least a portion of the source/drain sidewall spacers 410. In this embodiment, the plasma dry etch includes the gases Ar, $O_2$ and $CH_2F_2$ flowing in a plasma reactor with an RF power between about 100 Watts and about 500 Watts, and a pressure ranging from about 20 mTorr to about 100 mTorr. Other chemistries, powers, pressures, etc. could nonetheless be used. While a dry etch has been detailed, a wet etch could also be used.

Figure 7:
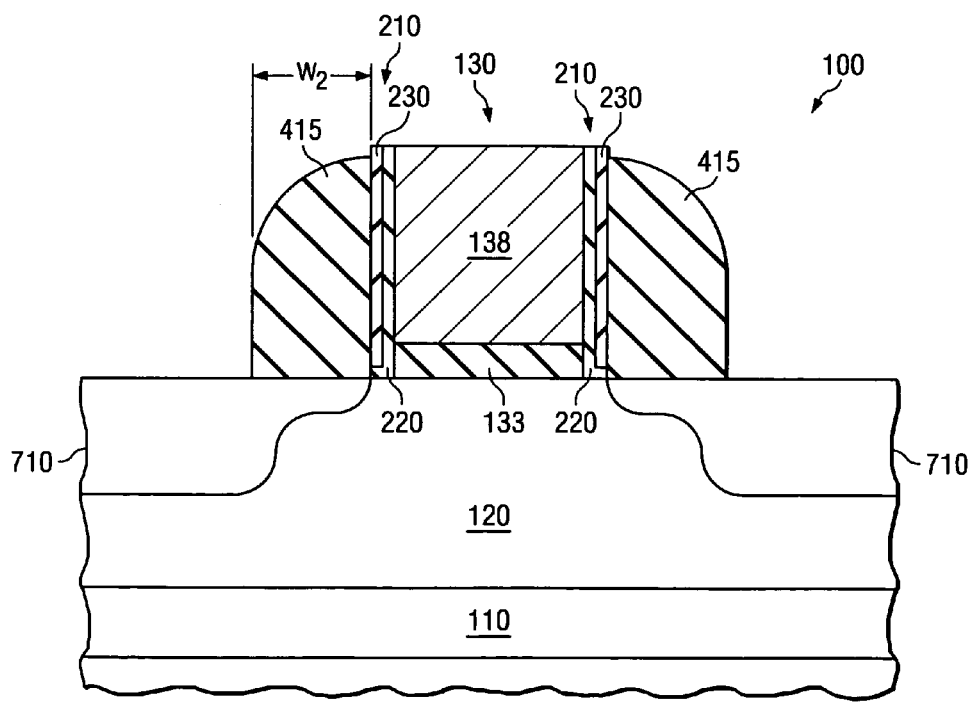
FIG. 7 illustrates a cross-sectional view of the partially completed semiconductor device illustrated in FIG. 6 after annealing the heavily doped source/drain implants and lightly doped source/drain extension implants to form source/drain regions.

Turning now to FIG. 7, illustrated is a cross-sectional view of the partially completed semiconductor device 100 illustrated in FIG. 6 after annealing the heavily doped source/drain implants 510 and lightly doped source/drain extension implants 310 to form source/drain regions 710. As the source/drain sidewall spacers 410 have been etched at this stage of manufacture of the semiconductor device 100, a maximum allowable amount of hydrogen outdiffusion occurs when the heavily doped source/drain implants 510 and lightly doped source/drain extension implants 310 are annealed.

Generally, thermal anneal procedures are based on the principle of radiation heating. The semiconductor device 100 is placed in a chamber fitted with gas inlets and exhaust outlets. Inside the chamber, a heat source provides the desired heating for a specified period of time. Heat sources include graphite heaters, microwave, plasma arc, tungsten halogen lamps, and the like. In the current embodiment, this thermal source/drain anneal is conducted at a temperature of greater than about 800° C., and in one advantageous embodiment a temperature ranging from about 900° C. to about 1300° C., for a time period ranging from about 1 seconds to about 30 seconds. It should be noted that not only does the anneal activate the source/drain regions 710, it also fixes any silicon imperfections caused by the previous implantation processes.

Figure 8:
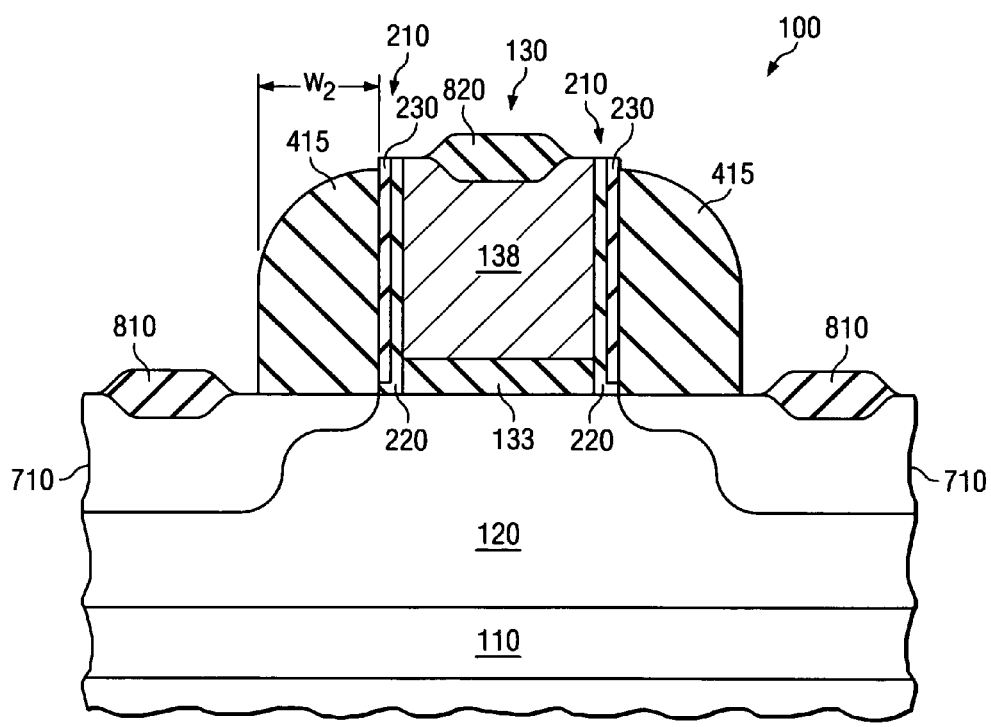
FIG. 8 illustrates a cross-sectional view of the partially completed semiconductor device illustrated in FIG. 7 after conventionally forming silicided source/drain regions and a silicided gate electrode layer.

Turning now to FIG. 8, illustrated is a cross-sectional view of the partially completed semiconductor device 100 illustrated in FIG. 7 after conventionally forming silicided source/drain regions 810 and a silicided gate electrode layer 820. The skilled artisan understands the conventional silicided source/drain region 810 and silicided gate electrode layer 820 formation process. In sum, the process includes forming a metal layer, possibly cobalt, nickel, etc., over the substrate 110 and gate structure 130, and subjecting the metal layer to an anneal, causing the metal to react with the silicon of the substrate 110, and in this instance the gate electrode layer 138, and form the silicided source/drain regions 810 and silicided gate electrode layer 820.

Figure 9:
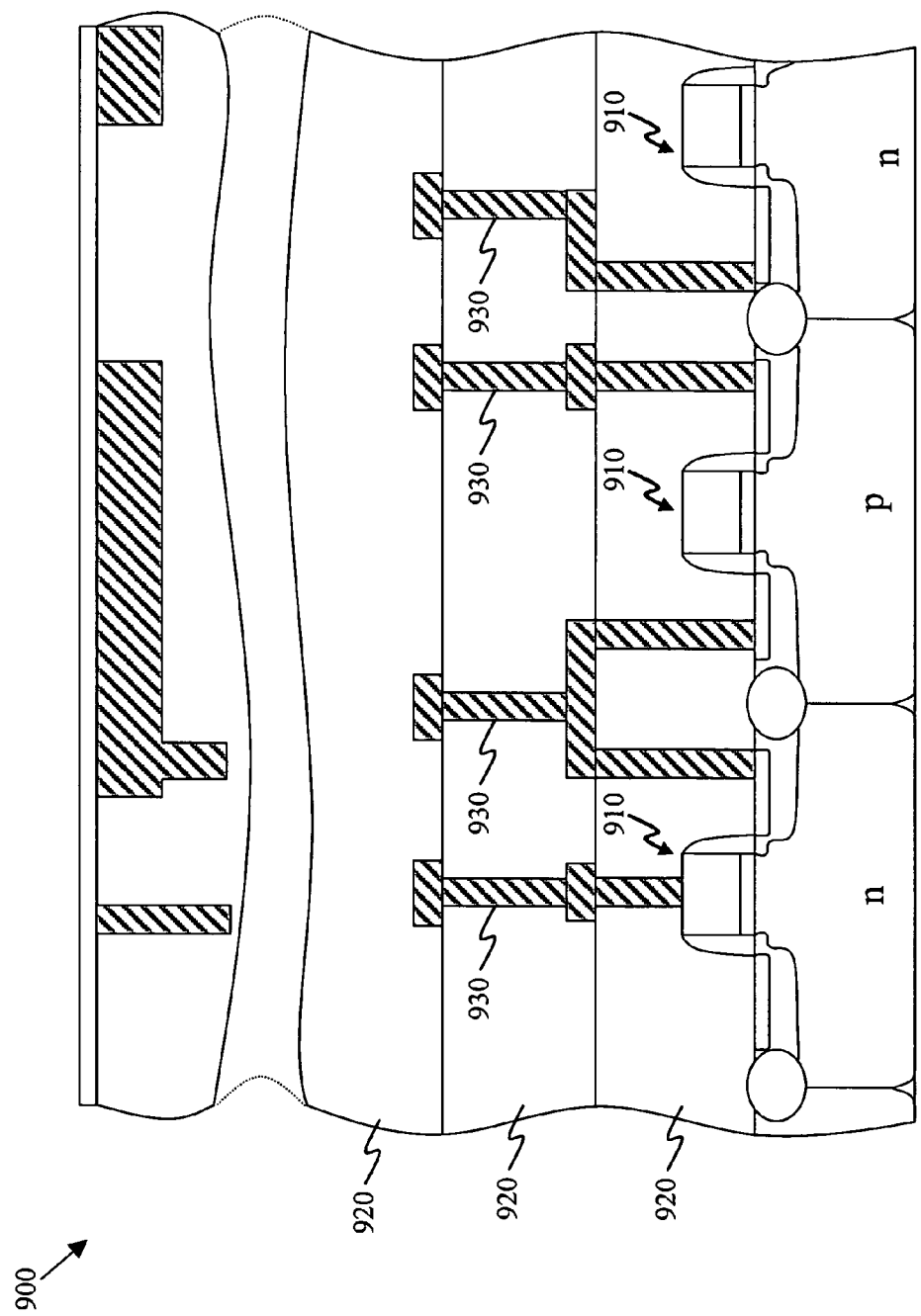
FIG. 9 illustrates a cross-sectional view of a conventional integrated circuit (IC) incorporating a semiconductor device constructed according to the principles of the present invention.

Referring finally to FIG. 9, illustrated is a cross-sectional view of a conventional integrated circuit (IC) 900 incorporating a semiconductor device 910 constructed according to the principles of the present invention. The IC 900 may include devices, such as transistors used to form CMOS devices, BiCMOS devices, Bipolar devices, or other types of devices. The IC 900 may further include passive devices, such as inductors or resistors, or it may also include optical devices or optoelectronic devices. Those skilled in the art are familiar with these various types of devices and their manufacture. In the particular embodiment illustrated in FIG. 9, the IC 900 includes the semiconductor device 910 having dielectric layers 920 located thereover. Additionally, interconnect structures 930 are located within the dielectric layers 920 to interconnect various devices, thus, forming the operational integrated circuit 900.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
    forming a gate structure over a substrate;
    placing source/drain extension implants into the substrate proximate the gate structure;
    forming sidewall spacers on opposing sidewalls of the gate structure after placing the source/drain extension implants into the substrate, the sidewall spacers having a first width;
    reducing the first width to a second smaller width after forming the sidewall spacers; and
    annealing the source/drain extension implants to form source/drain regions after reducing the first width of the sidewall spacers.

2. The method as recited in claim 1 wherein the sidewall spacers are source/drain sidewall spacers and further including placing heavily doped source/drain implants into the substrate proximate the gate structure after reducing the first width, wherein annealing includes annealing the source/drain extension implants and the heavily doped source/drain implants to form source/drain regions.

3. The method as recited in claim 1 wherein reducing the first width includes removing up to about 30 nm of width of each of the sidewall spacers.

4. The method as recited in claim 3 wherein removing up to about 30 nm of width of each of the sidewall spacers includes removing from about 10 nm to about 20 nm of width of each of the sidewall spacers.

5. The method as recited in claim 1 further including forming silicided source/drain regions in the source/drain regions after annealing the source/drain extension implants to form source/drain regions.

6. The method as recited in claim 1 wherein forming sidewall spacers on opposing sidewalls of a gate structure includes forming a layer of nitride material over the gate structure and etching the layer of nitride material to form an all nitride sidewall spacer.

7. The method as recited in claim 1 wherein forming sidewall spacers on opposing sidewalls of a gate structure includes forming a layer of nitride material over the gate structure and anisotropically etching the layer of nitride material to form an all nitride sidewall spacer.

8. The method as recited in claim 1 wherein the sidewall spacers include more than one layers, at least one layer being an L-shaped spacer.

9. The method as recited in claim 1 wherein reducing a first width of the sidewall spacers includes reducing a first width of the sidewall spacers using a dry etch.

10. A method for manufacturing an integrated circuit, comprising:
    forming semiconductor devices over a substrate, including;
        forming gate structures over the substrate;
        placing source/drain extension implants into the substrate proximate the gate structures;
        forming sidewall spacers on opposing sidewalls of the gate structures after placing the source/drain extension implants into the substrate, the sidewall spacers having a first width
        reducing the first width to a second smaller width after forming the sidewall spacers; and
        annealing the source/drain extension implants to form source/drain regions after reducing the first width of the sidewall spacers; and
    forming dielectric layers over the semiconductor devices, the dielectric layers having interconnects therein for contacting the semiconductor devices and thereby forming an operational integrated circuit.

11. The method as recited in claim 10 wherein the sidewall spacers are source/drain sidewall spacers and further including placing heavily doped source/drain implants into the substrate proximate the gate structure after reducing the first width, wherein annealing includes annealing the source/drain extension implants and the heavily doped source/drain implants to form source/drain regions.

12. The method as recited in claim 10 wherein reducing the first width includes removing up to about 30 nm of width of each of the sidewall spacers.

13. The method as recited in claim 12 wherein removing up to about 30 nm of width of each of the sidewall spacers includes removing from about 10 nm to about 20 nm of width of each of the sidewall spacers.

14. The method as recited in claim 10 further including forming silicided source/drain regions in the source/drain regions after annealing the source/drain extension implants to form source/drain regions.

15. The method as recited in claim 10 wherein forming sidewall spacers on opposing sidewalls of the gate structures includes forming a layer of nitride material over the gate structures and etching the layer of nitride material to form an all nitride sidewall spacers.

16. The method as recited in claim 10 wherein forming sidewall spacers on opposing sidewalls of the gate structures includes forming a layer of nitride material over the gate structures and anisotropically etching the layer of nitride material to form all nitride sidewall spacers.

17. The method as recited in claim 10 wherein the sidewall spacers include more than one layers, at least one layer being an L-shaped spacer.

18. The method as recited in claim 10 wherein reducing a first width of the sidewall spacers includes reducing a first width of the sidewall spacers using a dry etch.

* * * * *